United States Patent
Ikeda

(10) Patent No.: US 6,268,239 B1
(45) Date of Patent: Jul. 31, 2001

(54) SEMICONDUCTOR CHIP COOLING STRUCTURE AND MANUFACTURING METHOD THEREOF

(75) Inventor: Renya Ikeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/552,797

(22) Filed: Apr. 20, 2000

(30) Foreign Application Priority Data

Apr. 20, 1999 (JP) .................................................. 11-112938

(51) Int. Cl.[7] .................................................... H01L 21/44
(52) U.S. Cl. ......................... 438/122; 438/121; 438/125; 257/717; 257/719
(58) Field of Search ..................................... 438/111, 121, 438/122, 123, 124, 125, 126; 257/717, 718, 719, 712, 713

(56) References Cited

U.S. PATENT DOCUMENTS

| | | |
|---|---|---|
| 4,396,936 | 8/1983 | McIver et al. |
| 5,736,785 | 4/1998 | Chiang et al. ........................ 257/712 |
| 5,814,535 * | 9/1998 | Shimada et al. ..................... 438/122 |
| 5,930,601 * | 7/1999 | Cannizzaro et al. ................. 438/122 |
| 5,946,544 * | 8/1999 | Estes et al. ........................... 438/122 |
| 5,985,697 * | 11/1999 | Chaney et al. ....................... 257/719 |
| 5,999,415 * | 12/1999 | Hamzehdoost ....................... 438/122 |
| 6,016,006 * | 1/2000 | Kolman et al. ...................... 257/717 |
| 6,020,219 * | 2/2000 | Dudderar et al. .................... 438/122 |
| 6,130,113 * | 10/2000 | Eslamy et al. ....................... 438/122 |

FOREIGN PATENT DOCUMENTS 61-42431 9/1986 (JP).
10-209348 8/1998 (JP).

* cited by examiner

*Primary Examiner*—Kevin M. Picardat
(74) *Attorney, Agent, or Firm*—Foley & Lardner

(57) ABSTRACT

A semiconductor chip is mounted on a small-size circuit board having a hole, in flip-chip mounting. The small-size circuit board is connected to a large-size circuit board so that the semiconductor chip will be placed between the small-size circuit board and the large-size circuit board and there will be a clearance between the semiconductor chip and the large-size circuit board. A heat sink is provided with a convex part for being inserted into the hole of the small-size circuit board to be thermally connected to the surface of the semiconductor chip through a thermal conduction material which is sandwiched between the convex part and the semiconductor chip. The heat sink is fixed to the large-size circuit board by means of fixation screws etc. so that the semiconductor chip and the small-size circuit board will be placed between the heat sink and the large-size circuit board. The fixation load for fixing the heat sink to the large-size circuit board is not applied to the semiconductor chip at all and thereby damages to the semiconductor chip due to the fixation is eliminated. The surface of the semiconductor chip is almost directly connected to the convex part of the heat sink via the thermal conduction material, therefore, the cooling of the semiconductor chip in flip-chip mounting is executed with high cooling efficiency.

28 Claims, 2 Drawing Sheets

SEMICONDUCTOR CHIP COOLING STRUCTURE AND MANUFACTURING METHOD THEREOF

BACKGROUND OF THE INVENTION

The present invention relates to a semiconductor chip cooling structure and a manufacturing method of a semiconductor chip cooling structure, and in particular, to a semiconductor chip cooling structure and a manufacturing method of a semiconductor chip cooling structure for a semiconductor chip which is mounted on a circuit board in "flip-chip" mounting.

DESCRIPTION OF THE PRIOR ART

A semiconductor chip cooling structure, that is, a structure for letting a semiconductor chip release its heat and thereby cooling the semiconductor chip, has generally been implemented by use of a heat sink and a thermal conduction material such as a rubber sheet. FIG. 1 is a cross sectional view showing an example of a conventional semiconductor chip cooling structure. Referring to FIG. 1, a semiconductor chip (in "flip-chip" mounting) is mounted on a circuit board by means of solder balls etc. so that its surface will face downward onto the circuit board. A thermal conduction material such as a rubber sheet is attached to the back side of the semiconductor chip, and a heat sink is attached to the back of the thermal conduction material. The heat sink is fixed to the circuit board by means of fixation screws (bolts and nuts) etc. so as not to drop from the semiconductor chip and the circuit board.

In a "Semiconductor Package Structure for Promoting Heat Emission Effect" which has been disclosed in Japanese Patent Application Laid-Open No.HEI10-209348 (hereafter, referred to as a "second conventional semiconductor chip cooling structure"), a semiconductor chip is mounted on a circuit board so that its surface will face upward, and a heat emission piece is attached to the surface of the semiconductor chip, not to the back of the semiconductor chip. The heat emission piece is implemented by, for example, a metal plate which is substantially square. To the surface of the heat emission piece, convexity, concavity, holes, etc. are provided for some purposes including the prevention of damages to the surface of the semiconductor chip or bonding wires when the heat emission piece is attached. By such a structure, the heat of the semiconductor chip can be released not only from its back side but also from its upper surface, and thereby the heat emission effect is improved considerably.

In a "cooling structure for an integrated circuit package" which has been disclosed in Japanese Publication of Examined Patent Applications No.SHO61-42431 (hereafter, referred to as a "third conventional semiconductor chip cooling structure"), a heat sink is attached to a heat sink pad which has been formed on the back of a circuit board, and an IC chip is mounted on the surface of the circuit board in "flip-chip" mounting. Heat conduction channels are provided to the circuit board so as to penetrate the circuit board and thereby thermally connect the active surface of the IC chip and the heat sink on the back of the circuit board. A material (plastic, solder, etc.) having a thermoplastic/setting property and large thermal conductivity is filled in the heat conduction channels by heating the circuit board so as to lower thermal impedance between the IC chip and the heat sink. In conventional flip-chip packages, the active surface of the IC chip faces the circuit board and thus heat emission from the active surface tended to be disturbed by the existence of the circuit board and it has been difficult to successfully release the heat emitted by the IC chip or semiconductor chip especially when large scale IC chips emitting large amount of heat are used. The third conventional semiconductor chip cooling structure has been proposed in order to resolve the heat problems of the flip-chip packages.

However, the conventional techniques which have been described above involve the following problems or drawbacks. First, in the first conventional semiconductor chip cooling structure of FIG. 1, the heat sink is fixed to the circuit board by means of fixation screws (bolts and nuts) etc. so as to sandwich the semiconductor chip of flip-chip mounting. Due to such fixation of the heat sink, the load for the fixation of the heat sink to the circuit board is also applied to the semiconductor chip through the thermal conduction material, and thus damages to the semiconductor chip are easily caused due to the fixation load. Further, the first conventional semiconductor chip cooling structure of FIG. 1 cools the semiconductor chip from its back side. The operations of the semiconductor chip occur in its diffusion layers, electrodes, lines, etc. which have been formed on the surface (0~a few $\mu$m in depth) of the semiconductor chip, and heat is evolved from the active surface layer of the semiconductor chip. The thickness of the semiconductor chip is as large as approximately 400 $\mu$m, and thus it is clear that the cooling from the back side is inefficient than cooling from the surface.

The second conventional semiconductor chip cooling structure cools the semiconductor chip from its surface by use of the heat emission piece (square metal plate etc.). However, the structure can not be applied to the flip-chip mounting having the advantage in miniaturization of the whole package.

The third conventional semiconductor chip cooling structure executes cooling of the semiconductor chip (IC chip) of flip-chip mounting from its surface. However, the cooling of the flip-chip is mainly done through the thermally conductive material (plastic, solder, etc.) which is filled in the heat conduction channels of the circuit board by heating. Thermal conductivity of the thermally conductive material (plastic etc.) is generally smaller than that of the metal heat sink itself and the length of the path of heat conduction through the thermally conductive plastic is longer than the thickness of the circuit board, therefore, it is difficult to attain a high cooling efficiency by the third conventional semiconductor chip cooling structure. Further, the thermal conductivity of the thermally conductive material (plastic, solder, etc.) which is filled in the heat conduction channels by heating is affected by flowing/setting statuses of the thermally conductive material in the heat conduction channels. If bubbles, interfaces, unevenness etc. are formed in the heat conduction channels in the setting of the thermally conductive material, the thermal conductivity through the heat conduction channels is easily deteriorated.

SUMMARY OF THE INVENTION

It is therefore the primary object of the present invention to provide a semiconductor chip cooling structure and a manufacturing method of a semiconductor chip cooling structure, by which cooling of a semiconductor chip mounted on a circuit board in flip-chip mounting can be executed from its surface with high cooling efficiency and without causing damages due to the fixation loads etc. to the semiconductor chip.

In accordance with a first aspect of the present invention, there is provided a semiconductor chip cooling structure comprising a semiconductor chip, a small-size circuit board, a large-size circuit board and a heat sink. The semiconductor chip is mounted on the small-size circuit board having a hole, in flip-chip mounting. The small-size circuit board is connected to the large-size circuit board so that the semiconductor chip will be placed between the small-size circuit board and the large-size circuit board and there will be a clearance between the semiconductor chip and the large-size circuit board. The heat sink is provided with a convex part for being inserted into the hole of the small-size circuit board to be thermally connected to the surface of the semiconductor chip through a thermal conduction material which is sandwiched between the convex part and the semiconductor chip. The heat sink is fixed to the large-size circuit board by means of fixation means so that the semiconductor chip and the small-size circuit board will be placed between the heat sink and the large-size circuit board.

In accordance with a second aspect of the present invention, in the first aspect, a material which is easily deformed is employed as the thermal conduction material which is sandwiched between the convex part of the heat sink and the semiconductor chip.

In accordance with a third aspect of the present invention, in the second aspect, the thermal conduction material is implemented by thermal conduction grease.

In accordance with a fourth aspect of the present invention, in the second aspect, the thermal conduction material is implemented by a thermal conduction rubber sheet.

In accordance with a fifth aspect of the present invention, in the first aspect, mechanical fixation means such as screws are employed as the fixation means for fixing the heat sink to the large-size circuit board.

In accordance with a sixth aspect of the present invention, in the first aspect, the small-size circuit board is connected to the large-size circuit board by means of solder balls each of which including a copper ball so that enough space can be provided between the small-size circuit board and the large-size circuit board.

In accordance with a seventh aspect of the present invention, in the first aspect, the structure between the small-size circuit board and the large-size circuit board is sealed by a sealing material such as epoxy resin.

In accordance with an eighth aspect of the present invention, there is provided a semiconductor chip cooling structure comprising N (N: 2, 3, 4, . . . ) semiconductor chips, a small-size circuit board a large-size circuit board and a heat sink. The small-size circuit board has N holes corresponding to the N semiconductor chips. The N semiconductor chips are mounted on the small-size circuit board in flip-chip mounting. The small-size circuit board is connected to the large-size circuit board so that the N semiconductor chips will be placed between the small-size circuit board and the large-size circuit board and there will be clearances between the N semiconductor chips and the large-size circuit board. The heat sink is provided with N convex parts for being inserted into the N holes of the small-size circuit board respectively so that each convex part will be thermally connected to the surface of a corresponding semiconductor chip through a thermal conduction material which is sandwiched between the convex part and the semiconductor chip. The heat sink is fixed to the large-size circuit board by means of fixation means so that the N semiconductor chips and the small-size circuit board will be placed between the heat sink and the large-size circuit board.

In accordance with a ninth aspect of the present invention, in the eighth aspect, materials which are easily deformed are employed as the thermal conduction materials which are sandwiched between the N convex parts of the heat sink and the N semiconductor chips.

In accordance with a tenth aspect of the present invention, in the ninth aspect, the thermal conduction material is implemented by thermal conduction grease.

In accordance with an eleventh aspect of the present invention, in the ninth aspect, the thermal conduction material is implemented by a thermal conduction rubber sheet.

In accordance with a twelfth aspect of the present invention, in the eighth aspect, mechanical fixation means such as screws are employed as the fixation means for fixing the heat sink to the large-size circuit board.

In accordance with a thirteenth aspect of the present invention, in the eighth aspect, the small-size circuit board is connected to the large-size circuit board by means of solder balls each of which including a copper ball so that enough space can be provided between the small-size circuit board and the large-size circuit board.

In accordance with a fourteenth aspect of the present invention, in the eighth aspect, the structure between the small-size circuit board and the large-size circuit board is sealed by a sealing material such as epoxy resin.

In accordance with a fifteenth aspect of the present invention, there is provided a manufacturing method of a semiconductor chip cooling structure. The manufacturing method comprises a semiconductor chip mounting step, a small-size circuit board connection step, and a heat sink fixation step. In the semiconductor chip mounting step, a semiconductor chip is mounted in flip-chip mounting on a small-size circuit board which has a hole for the semiconductor chip. In the small-size circuit board connection step, the small-size circuit board is connected to a large-size circuit board so that the semiconductor chip will be placed between the small-size circuit board and the large-size circuit board and there will be a clearance between the semiconductor chip and the large-size circuit board. In the heat sink fixation step, a heat sink, which is provided with a convex part for being inserted into the hole of the small-size circuit board, is fixed to the large-size circuit board by means of fixation means so that the semiconductor chip and the small-size circuit board will be placed between the heat sink and the large-size circuit board and so that the convex part of the heat sink will be thermally connected to the surface of the semiconductor chip through a thermal conduction material which is sandwiched between the convex part and the semiconductor chip.

In accordance with a sixteenth aspect of the present invention, in the fifteenth aspect, a material which is easily deformed is employed as the thermal conduction material which is sandwiched between the convex part of the heat sink and the semiconductor chip.

In accordance with a seventeenth aspect of the present invention, in the sixteenth aspect, the thermal conduction material is implemented by thermal conduction grease.

In accordance with an eighteenth aspect of the present invention, in the sixteenth aspect, the thermal conduction material is implemented by a thermal conduction rubber sheet.

In accordance with a nineteenth aspect of the present invention, in the heat sink fixation step of the fifteenth aspect, mechanical fixation means such as screws are employed as the fixation means for fixing the heat sink to the large-size circuit board.

In accordance with a twentieth aspect of the present invention, in the small-size circuit board connection step of the fifteenth aspect, the small-size circuit board is connected to the large-size circuit board by means of solder balls each of which including a copper ball so that enough space can be provided between the small-size circuit board and the large-size circuit board.

In accordance with a twenty-first aspect of the present invention, in the fifteenth aspect, the manufacturing method further comprises a sealing step. In the sealing step, the structure between the small-size circuit board and the large-size circuit board is sealed by a sealing material such as epoxy resin.

In accordance with a twenty-second aspect of the present invention, there is provided a manufacturing method of a semiconductor chip cooling structure. The manufacturing method comprises a semiconductor chip mounting step, a small-size circuit board connection step, and a heat sink fixation step. In the semiconductor chip mounting step, N (N: 2, 3, 4, . . . ) semiconductor chips are mounted in flip-chip mounting on a small-size circuit board which has N holes for the N semiconductor chips. In the small-size circuit board connection step, the small-size circuit board is connected to a large-size circuit board so that the N semiconductor chips will be placed between the small-size circuit board and the large-size circuit board and there will be clearances between the N semiconductor chips and the large-size circuit board. In the heat sink fixation step, a heat sink, which is provided with N convex parts for being inserted into the N holes of the small-size circuit board respectively, is fixed to the large-size circuit board by means of fixation means so that the semiconductor chip and the small-size circuit board will be placed between the heat sink and the large-size circuit board and so that each convex part of the heat sink will be thermally connected to the surface of a corresponding semiconductor chip through a thermal conduction material which is sandwiched between the convex part and the semiconductor chip.

In accordance with a twenty-third aspect of the present invention, in the twenty-second aspect, materials which are easily deformed are employed as the thermal conduction materials which are sandwiched between the N convex parts of the heat sink and the N semiconductor chips.

In accordance with a twenty-fourth aspect of the present invention, in the twenty-third aspect, the thermal conduction material is implemented by thermal conduction grease.

In accordance with a twenty-fifth aspect of the present invention, in the twenty-third aspect, the thermal conduction material is implemented by a thermal conduction rubber sheet.

In accordance with a twenty-sixth aspect of the present invention, in the heat sink fixation step of the twenty-second aspect, mechanical fixation means such as screws are employed as the fixation means for fixing the heat sink to the large-size circuit board.

In accordance with a twenty-seventh aspect of the present invention, in the small-size circuit board connection step of the twenty-second aspect, the small-size circuit board is connected to the large-size circuit board by means of solder balls each of which including a copper ball so that enough space can be provided between the small-size circuit board and the large-size circuit board.

In accordance with a twenty-eighth aspect of the present invention, in the twenty-second aspect, the manufacturing method further comprises a sealing step. In the sealing step, the structure between the small-size circuit board and the large-size circuit board is sealed by a sealing material such as epoxy resin.

BRIEF DESCRIPTION OF THE DRAWINGS

The objects and features of the present invention will become more apparent from the consideration of the following detailed description taken in conjunction with the accompanying drawings, in which.

DESCRIPTION OF THE PREFERRED EMBODIMENTS

Figure 1:
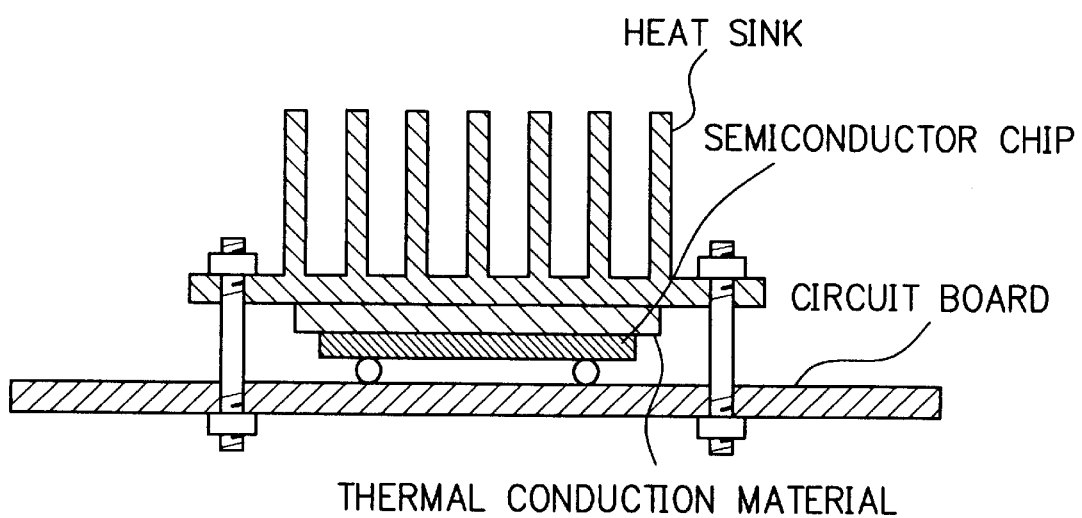
FIG. 1 is a cross sectional view showing an example of a conventional semiconductor chip cooling structure.

Referring now to the drawings, a description will be given in detail of preferred embodiments in accordance with the present invention.

Figure 2:
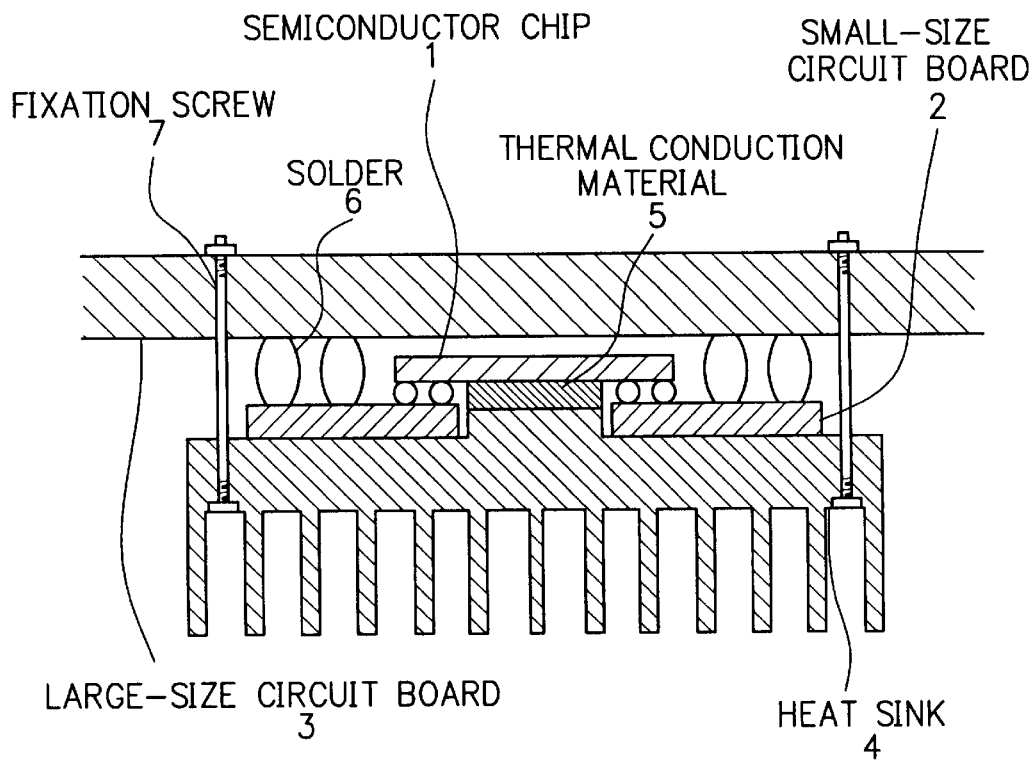
FIG. 2 is a cross sectional view showing a semiconductor chip cooling structure in accordance with a first embodiment of the present invention.

FIG. 2 is a cross sectional view showing a semiconductor chip cooling structure in accordance with a first embodiment of the present invention. Referring to FIG. 2, the semiconductor chip cooling structure of the first embodiment includes a semiconductor chip 1, a small-size circuit board 2, a large-size circuit board 3, a heat sink 4, a thermal conduction material 5, solder 6, and fixation screws (bolts and nuts) 7. The small-size circuit board 2 can be a single layer circuit board or a multilayer circuit board. The large-size circuit board 3 can also be a single layer circuit board or a multilayer circuit board. The heat sink 4 for emitting the heat of the semiconductor chip 1 is formed of aluminium, copper, etc. The solder 6 is used in the semiconductor chip cooling structure of FIG. 2 as electrically conductive joints.

The semiconductor chip 1 is mounted on the small-size circuit board 2 with its surface facing downward onto the small-size circuit board 2. At the center of the small-size circuit board 2, a hole whose aria is smaller than that of the semiconductor chip 1 is provided.

The small-size circuit board 2 is mounted on the large-size circuit board 3 by means of electrically conductive joints such as the solder 6. At the center of the upper surface of the heat sink 4, a convex part corresponding to the center hole of the small-size circuit board 2 is formed. The heat sink 4 is fixed to the large-size circuit board 3 by fixation means such as the fixation screws 7. Between the convex part of the heat sink 4 and the semiconductor chip 1, the thermal conduction material 5 (a thermal conduction compound, thermal conduction grease, a thermal conduction rubber sheet, etc.) is filled or sandwiched. Incidentally, in the example of FIG. 2, no fixation means is provided between the small-size circuit board 2 and the heat sink 4. The small-size circuit board 2 and the heat sink 4 contact each other due to the fixation by the fixation screws 7.

In the following, an example of a manufacturing method of the semiconductor chip cooling structure of FIG. 2 will be explained in detail.

First, the semiconductor chip 1 is mounted on the small-size circuit board 2 by connecting (by means of soldering etc.) surface electrodes of the semiconductor chip 1 and pads of the small-size circuit board 2 which have preliminarily been formed so as to face the surface electrodes of the semiconductor chip 1. The small-size circuit board 2 on which the semiconductor chip 1 has been mounted is thereafter connected to the large-size circuit board 3 by the solder 6. By the connection by the solder 6, electrical connection between the small-size circuit board 2 and the large-size circuit board 3 is established. At this stage, the semiconductor chip 1, the small-size circuit board 2 and the large-size circuit board 3 have been connected together as an electrically connected block.

Meanwhile, on the convex part of the heat sink 4, the thermal conduction material 5 is previously applied or attached. Thereafter, the heat sink 4 is attached to the large-size circuit board 3 by means of the fixation means such as the fixation screws 7. Due to the fixation by means of the fixation screws 7, the heat sink 4 approaches and thereafter contacts the lower surface of the small-size circuit board 2. Incidentally, the height of the convex part of the heat sink 4 and the thickness of the thermal conduction material 5 have been determined and designed so that thermal connection between the semiconductor chip 1 and the heat sink 4 can be secured enough.

The load (pressure) for fixing the heat sink 4 to the large-size circuit board 3 is held and supported by the small-size circuit board 2 and the solder 6 connecting the small-size circuit board 2 to the large-size circuit board 3, therefore, the load for the fixation is not applied to the semiconductor chip 1 at all. Meanwhile, a load that is applied to the semiconductor chip 1 is determined by the relationship between two thicknesses: a first thickness of the convex part of the heat sink 4 and the thermal conduction material 5 added together and a second thickness of the small-size circuit board 2 and the chip connection part (between the semiconductor chip 1 and the small-size circuit board 2) added together. Therefore, the load applied to the semiconductor chip 1 is determined independently from the load for fixing the heat sink 4 to the large-size circuit board 3. Thus, the load applied to the semiconductor chip 1 can be controlled and reduced enough by designing the dimensions of the parts appropriately, and damages to the semiconductor chip 1 due to the fixation load can be eliminated. Especially, if the thermal conduction material 5 is implemented by an easily deformed material or a pressure- absorbing material such as thermal conduction grease, a thermal conduction rubber sheet, etc., the effect of the fixation load to the semiconductor chip 1 can be absorbed and eliminated without the need of determining a precise thickness of the thermal conduction material 5.

Further, in the semiconductor chip cooling structure of the above embodiment, the surface of the semiconductor chip 1 is almost directly connected to the convex part of the heat sink 4 via the thermal conduction material 5, therefore, the cooling of the semiconductor chip 1 can be executed more efficiently in comparison with the conventional semiconductor chip cooling structures for flip chip mounting which cool the semiconductor chip from its back side or through the heat conduction channels of the circuit board.

In the following, a concrete example of the semiconductor chip cooling structure in accordance with the first embodiment of the present invention will be described in detail referring to FIG. 2.

The size and the thickness of the semiconductor chip 1 is 3 mm×3 mm and 350 $\mu$m, for example. On the peripheral part (other than the center) of the surface of the semiconductor chip 1, a plurality of surface electrodes are provided as input/output terminals. The small-size circuit board 2 is a build-up circuit board of a size of 23 mm×23 mm×1 mm (length, width, thickness) having the center hole of 11 mm×11 mm, for example. On the surface of the small-size circuit board 2, pads A for the connection to the semiconductor chip 1 and pads B for the connection to the large-size circuit board 3 are provided. The large-size circuit board 3 is a glass-epoxy board of a size of 300 mm×300 mm×1.6 mm, for example. The large-size circuit board 3 is provided with pads for the connection to the small-size circuit board 2 on its surface and holes for passing the heat sink fixation screws 7. The heat sink 4 is an aluminium heat sink of a size of 43 mm×43 mm for example, having the convex part of a size of 10 mm×10 mm×0.8 mm for example at the center of its surface. The heat sink 4 is provided with holes for passing the fixation screw 7 at its four corners and cooling fins on its back side.

On each surface electrode of the semiconductor chip 1, an Au bump is preliminarily formed. Meanwhile, on each pad A of the small-size circuit board 2, a solder layer is preliminarily formed by means of deposition. The semiconductor chip 1 is held by a holder (vacuum chuck etc.), heated by the holder at a temperature higher than the melting point of the solder, and pressed with a proper pressure onto the small-size circuit board 2 which has been heated at a temperature lower than the melting point of the solder, thereby the solder on the pads A is melted and thereby the Au bumps of the semiconductor chip 1 and the pads A of the small-size circuit board 2 are stuck together. When the semiconductor chip 1 is released by the vacuum chuck, the solder hardens and thereby the connection between the pads A and the Au bumps (i.e. the connection between the small-size circuit board 2 and the semiconductor chip 1) is completed. Subsequently, on each pads B of the small-size circuit board 2, a solder ball is formed by applying solder paste on the pad B, putting a Cu ball of a diameter of 450 $\mu$m on the paste, and executing reflow soldering. Meanwhile, on each pad of the large-size circuit board 3, solder paste is preliminarily applied. The small-size circuit board 2 to which the solder balls have been formed and the large-size circuit board 3 are put together and reflow soldering is executed, thereby the connection between the small-size circuit board 2 and the large-size circuit board 3 is completed. The solder balls (solder 6) are used in the semiconductor chip cooling structure of FIG. 2 for providing electrical connection and an appropriate space between the small-size circuit board 2 and the large-size circuit board 3. At this stage, the semiconductor chip 1, the small-size circuit board 2 and the large-size circuit board 3 have been connected together structurally and electrically.

On the side of the heat sink 4, the thermal conduction material 5 (a thermal conduction compound, thermal conduction grease, a thermal conduction rubber sheet, etc.) is preliminarily applied or attached to the convex part. The heat sink 4 to which the thermal conduction material 5 has been applied or attached is thereafter fixed to the large-size circuit board 3 by means of the fixation screws 7. Incidentally, the height of the convex part of the heat sink 4 and the thickness of the thermal conduction material 5 are determined and designed so that thermal connection between the semiconductor chip 1 and the heat sink 4 can be maintained enough.

As described above, in the semiconductor chip cooling structure in accordance with the first embodiment of the present invention, the fixation load for fixing the heat sink 4 to the large-size circuit board 3 is held and supported by the small-size circuit board 2 and the solder 6 which provides electrical connection between the small-size circuit board 2 and the large-size circuit board 3, therefore, the fixation load is not applied to the semiconductor chip 1 at all. A load that is applied to the semiconductor chip 1 is determined by the relationship between the two thicknesses: the first thickness of the convex part of the heat sink 4 and the thermal conduction material 5 added together and the second thickness of the small-size circuit board 2 and the chip connection part (between the semiconductor chip 1 and the small-size circuit board 2) added together, independently from the fixing load of the heat sink 4. Therefore, the load applied to the semiconductor chip 1 can be controlled and reduced enough by designing the dimensions of the parts appropriately, and thus damages to the semiconductor chip 1 due to the fixation load can be eliminated. In the case where the thermal conduction material 5 is implemented by an easily deformed material or a pressure-absorbing material such as thermal conduction grease, a thermal conduction rubber sheet, etc., the effect of the fixation load to the semiconductor chip 1 can be absorbed and eliminated without the need of determining a precise thickness of the thermal conduction material 5.

Further, the surface of the semiconductor chip 1 is almost directly connected to the convex part of the heat sink 4 via the thermal conduction material 5, therefore, cooing of the semiconductor chip 1 can be executed more efficiently in comparison with the conventional semiconductor chip cooling structures (for flip chip mounting) which cool the semiconductor chip from its back side or through the heat conduction channels of the circuit board.

Figure 3:
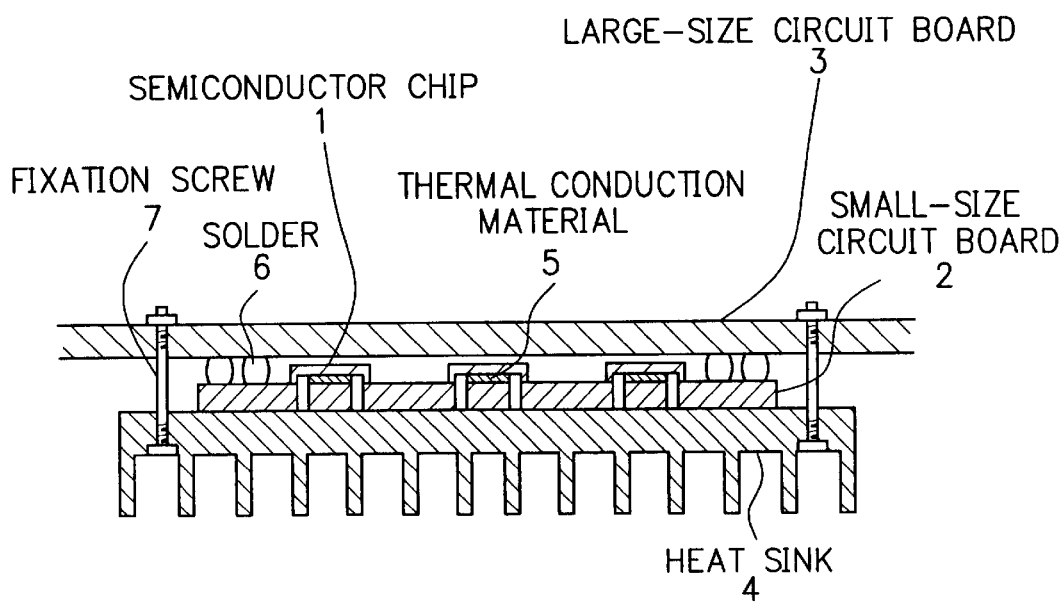
FIG. 3 is a cross sectional view showing a semiconductor chip cooling structure in accordance with a second embodiment of the present invention.

FIG. 3 is a cross sectional view showing a semiconductor chip cooling structure in accordance with a second embodiment of the present invention. Referring to FIG. 3, the semiconductor chip cooling structure -of the second embodiment includes a small-size circuit board 2, a large-size circuit board 3, a heat sink 4, solder 6, and fixation screws (bolts and nuts) 7, similarly to the first embodiment. However, the semiconductor chip cooling structure of the second embodiment is provided with N (N: 2, 3, . . . ) semiconductor chips 1 and N thermal conduction materials 5. In the example of FIG. 3, the number N of the semiconductor chips 1 is three. The small-size circuit board 2 is provided with N holes for the N semiconductor chips 1, and the heat sink 4 is provided with corresponding N convex parts.

The semiconductor chip cooling structure of the second embodiment can be manufactured similarly to the case of the first embodiment, as follows: First, the N semiconductor chips 1 are mounted on the small-size circuit board 2 by connecting (by means of soldering etc.) surface electrodes of the semiconductor chips 1 and pads of the small-size circuit board 2 which have preliminarily been formed so as to face the surface electrodes of the semiconductor chips 1. The small-size circuit board 2 on which the N semiconductor chips 1 have been mounted is thereafter connected to the large-size circuit board 3 by the solder 6. At this stage, the N semiconductor chips 1, the small-size circuit board 2 and the large-size circuit board 3 have been connected together as an electrically connected block. Meanwhile, on the N convex parts of the heat sink 4, the N thermal conduction materials 5 are previously applied or attached, respectively. Thereafter, the heat sink 4 is attached to the large-size circuit board 3 by means of the fixation screws 7 etc.

Incidentally, the height of the semiconductor chips 1 after being mounted on the small-size circuit board 2 generally varies slightly, and thereby small variation occurs in the distance between each semiconductor chip 1 and a corresponding convex part of the heat sink 4. However, the effects of the variation can be absorbed and eliminated by selecting the material for the thermal conduction material 5. Similarly to the case of the first embodiment, if an easily deformed material or a pressure-absorbing material (such as thermal conduction grease, a thermal conduction rubber sheet, etc.) is employed as the thermal conduction material 5, the effects of the variation can easily be absorbed and eliminated.

As described above, in the semiconductor chip cooling structure in accordance with the second embodiment of the present invention, the effects of the first embodiment can be obtained also in the case where two or more semiconductor chips 1 are mounted on the small-size circuit board 2.

As set forth hereinabove, in the semiconductor chip cooling structure and a manufacturing method of a semiconductor chip cooling structure in accordance with the present invention, a semiconductor chip 1 is mounted on a small-size circuit board 2 having a hole, in flip-chip mounting. The small-size circuit board 2 is connected to a large-size circuit board 3 so that the semiconductor chip 1 will be placed between the small-size circuit board 2 and the large-size circuit board 3 and there will be a clearance between the semiconductor chip 1 and the large-size circuit board 3. A heat sink 4 is provided with a convex part for being inserted into the hole of the small-size circuit board 2 to be thermally connected to the surface of the semiconductor chip 1 through a thermal conduction material 5 which is sandwiched between the convex part and the semiconductor chip 1. The heat sink 4 is fixed to the large-size circuit board 3 by means of fixation means such as the fixation screws 7 so that the semiconductor chip 1 and the small-size circuit board 2 will be placed between the heat sink 4 and the large-size circuit board 3.

Therefore, the fixation load for fixing the heat sink 4 to the large-size circuit board 3 is not applied to the semiconductor chip 1 at all and thereby damages to the semiconductor chip 1 due to the fixation can be eliminated. The surface of the semiconductor chip 1 is almost directly connected to the convex part of the heat sink 4 via the thermal conduction material 5, therefore, the cooling of the semiconductor chip 1 in flip-chip mounting can be executed with high cooling efficiency. The present invention is also applied to the cases where the number of the semiconductor chips 1 (i.e. the number of the holes of the small-size circuit board 2, the number of the convex parts of the heat sink 4, etc.) is N (N: 2, 3, 4, . . . ).

While the present invention has been described with reference to the particular illustrative embodiments, it is not to be restricted by those embodiments but only by the appended claims. For example, it is also possible to seal the structure between the small-size circuit board 2 and the large-size circuit board 3 or between the upper surface of the heat sink 4 and the large-size circuit board 3 by plastic or resin (epoxy resin etc.). It is to be appreciated that those skilled in the art can change or modify the embodiments without departing from the scope and spirit of the present invention.

What is claimed is:

1. A manufacturing method of a semiconductor chip cooling structure comprising the steps of:

a semiconductor chip mounting step in which a semiconductor chip is mounted in flip-chip mounting on a small-size circuit board which has a hole for the semiconductor chip;

a small-size circuit board connection step in which the small-size circuit board is connected to a large-size circuit board so that the semiconductor chip will be placed between the small-size circuit board and the large-size circuit board and there will be a clearance between the semiconductor chip and the large-size circuit board; and a heat sink fixation step in which a heat sink, which is provided with a convex part for being inserted into the hole of the small-size circuit board, is fixed to the large-size circuit board by means of fixation means so that the semiconductor chip and the small-size circuit board will be placed between the heat sink and the large-size circuit board and so that the convex part of the heat sink will be thermally connected to the surface of the semiconductor chip through a thermal conduction material which is sandwiched between the convex part and the semiconductor chip.

2. A manufacturing method of a semiconductor chip cooling structure as claimed in claim 1, wherein a material which is easily deformed is employed as the thermal conduction material which is sandwiched between the convex part of the heat sink and the semiconductor chip.

3. A manufacturing method of a semiconductor chip cooling structure as claimed in claim 2, wherein the thermal conduction material is implemented by thermal conduction grease.

4. A manufacturing method of a semiconductor chip cooling structure as claimed in claim 2, wherein the thermal conduction material is implemented by a thermal conduction rubber sheet.

5. A manufacturing method of a semiconductor chip cooling structure as claimed in claim 1, wherein in the heat sink fixation step, mechanical fixation means such as screws are employed as the fixation means for fixing the heat sink to the large-size circuit board.

6. A manufacturing method of a semiconductor chip cooling structure as claimed in claim 1, wherein in the small-size circuit board connection step, the small-size circuit board is connected to the large-size circuit board by means of solder balls each of which including a copper ball so that enough space can be provided between the small-size circuit board and the large-size circuit board.

7. A manufacturing method of a semiconductor chip cooling structure as claimed in claim 1, further comprising a sealing step in which the structure between the small-size circuit board and the large-size circuit board is sealed by a sealing material such as epoxy resin.

8. A manufacturing method of a semiconductor chip cooling structure comprising:
   a semiconductor chip mounting step in which N (N: 2, 3, 4, . . . ) semiconductor chips are mounted in flip-chip mounting on a small-size circuit board which has N holes for the N semiconductor chips;
   a small-size circuit board connection step in which the small-size circuit board is connected to a large-size circuit board so that the N semiconductor chips will be placed between the small-size circuit board and the large-size circuit board and there will be clearances between the N semiconductor chips and the large-size circuit board; and
   a heat sink fixation step in which a heat sink, which is provided with N convex parts for being inserted into the N holes of the small-size circuit board respectively, is fixed to the large-size circuit board by means of fixation means so that the semiconductor chip and the small-size circuit board will be placed between the heat sink and the large-size circuit board and so that each convex part of the heat sink will be thermally connected to the surface of a corresponding semiconductor chip through a thermal conduction material which is sandwiched between the convex part and the semiconductor chip.

9. A manufacturing method of a semiconductor chip cooling structure as claimed in claim 8, wherein materials which are easily deformed are employed as the thermal conduction materials which are sandwiched between the N convex parts of the heat sink and the N semiconductor chips.

10. A manufacturing method of a semiconductor chip cooling structure as claimed in claim 9, wherein the thermal conduction material is implemented by thermal conduction grease.

11. A manufacturing method of a semiconductor chip cooling structure as claimed in claim 9, wherein the thermal conduction material is implemented by a thermal conduction rubber sheet.

12. A manufacturing method of a semiconductor chip cooling structure as claimed in claim 8, wherein in the heat sink fixation step, mechanical fixation means such as screws are employed as the fixation means for fixing the heat sink to the large-size circuit board.

13. A manufacturing method of a semiconductor chip cooling structure as claimed in claim 8, wherein in the small-size circuit board connection step, the small-size circuit board is connected to the large-size circuit board by means of solder balls each of which including a copper ball so that enough space can be provided between the small-size circuit board and the large-size circuit board.

14. A manufacturing method of a semiconductor chip cooling structure as claimed in claim 8, further comprising a sealing step in which the structure between the small-size circuit board and the large-size circuit board is sealed by a sealing material such as epoxy resin.

15. A semiconductor chip cooling structure comprising:
   a semiconductor chip;
   a small-size circuit board having a hole, on which the semiconductor chip is mounted in flip-chip mounting;
   a large-size circuit board to which the small-size circuit board is connected so that the semiconductor chip will be placed between the small-size circuit board and the large-size circuit board and there will be a clearance between the semiconductor chip and the large-size circuit board; and
   a heat sink, which is provided with a convex part for being inserted into the hole of the small-size circuit board to be thermally connected to the surface of the semiconductor chip through a thermal conduction material which is sandwiched between the convex part and the semiconductor chip, and which is fixed to the large-size circuit board by means of fixation means so that the semiconductor chip and the small-size circuit board will be placed between the heat sink and the large-size circuit board.

16. A semiconductor chip cooling structure as claimed in claim 15, wherein a material which is easily deformed is employed as the thermal conduction material which is sandwiched between the convex part of the heat sink and the semiconductor chip.

17. A semiconductor chip cooling structure as claimed in claim 16, wherein the thermal conduction material is implemented by thermal conduction grease.

18. A semiconductor chip cooling structure as claimed in claim 16, wherein the thermal conduction material is implemented by a thermal conduction rubber sheet.

19. A semiconductor chip cooling structure as claimed in claim 15, wherein mechanical fixation means such as screws are employed as the fixation means for fixing the heat sink to the large-size circuit board.

20. A semiconductor chip cooling structure as claimed in claim 15, wherein the small-size circuit board is connected to the large-size circuit board by means of solder balls each of which including a copper ball so that enough space can be provided between the small-size circuit board and the large-size circuit board.

21. A semiconductor chip cooling structure as claimed in claim 15, wherein the structure between the small-size circuit board and the large-size circuit board is sealed by a sealing material such as epoxy resin.

22. A semiconductor chip cooling structure comprising:

N (N: 2, 3, 4, . . . ) semiconductor chips;

a small-size circuit board having N holes corresponding to the N semiconductor chips, on which the N semiconductor chips are mounted in flip-chip mounting;

a large-size circuit board to which the small-size circuit board is connected so that the N semiconductor chips will be placed between the small-size circuit board and the large-size circuit board and there will be clearances between the N semiconductor chips and the large-size circuit board; and a heat sink, which is provided with N convex parts for being inserted into the N holes of the small-size circuit board respectively so that each convex part will be thermally connected to the surface of a corresponding semiconductor chip through a thermal conduction material which is sandwiched between the convex part and the semiconductor chip, and which is fixed to the large-size circuit board by means of fixation means so that the N semiconductor chips and the small-size circuit board will be placed between the heat sink and the large-size circuit board.

23. A semiconductor chip cooling structure as claimed in claim 22, wherein materials which are easily deformed are employed as the thermal conduction materials which are sandwiched between the N convex parts of the heat sink and the N semiconductor chips.

24. A semiconductor chip cooling structure as claimed in claim 23, wherein the thermal conduction material is implemented by thermal conduction grease.

25. A semiconductor chip cooling structure as claimed in claim 23, wherein the thermal conduction material is implemented by a thermal conduction rubber sheet.

26. A semiconductor chip cooling structure as claimed in claim 22, wherein mechanical fixation means such as screws are employed as the fixation means for fixing the heat sink to the large-size circuit board.

27. A semiconductor chip cooling structure as claimed in claim 22, wherein the small-size circuit board is connected to the large-size circuit board by means of solder balls each of which including a copper ball so that enough space can be provided between the small-size circuit board and the large-size circuit board.

28. A semiconductor chip cooling structure as claimed in claim 22, wherein the structure between the small-size circuit board and the large-size circuit board is sealed by a sealing material such as epoxy resin.

* * * * *